(12) United States Patent
Kawaguchi et al.

(10) Patent No.: US 8,987,683 B2
(45) Date of Patent: Mar. 24, 2015

(54) CHARGED PARTICLE BEAM DRAWING APPARATUS AND CHARGED PARTICLE BEAM DRAWING METHOD

(71) Applicant: NuFlare Technology, Inc., Yokohama-shi (JP)

(72) Inventors: Michihiro Kawaguchi, Shizuoka-ken (JP); Kiminobu Akeno, Kanagawa-ken (JP); Yoshinori Kagawa, Tokyo (JP); Yu Asami, Shizuoka-ken (JP); Keisuke Yamaguchi, Shizuoka-ken (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/258,371

(22) Filed: Apr. 22, 2014

(65) Prior Publication Data

US 2014/0319373 A1   Oct. 30, 2014

(30) Foreign Application Priority Data

Apr. 26, 2013   (JP) .................................. 2013-093686

(51) Int. Cl.
*H01L 21/02* (2006.01)
*G21K 5/08* (2006.01)
(Continued)

(52) U.S. Cl.
CPC ............. *H01J 37/3002* (2013.01); *H01J 37/18* (2013.01); *H01L 21/02* (2013.01)
USPC .................. 250/443.1; 250/492.1; 250/492.2; 250/440.11; 250/441.11

(58) Field of Classification Search
CPC ............ G03F 7/70716; G03F 7/70858; G03F 7/70875; H01J 37/20; H01J 37/185; H01J 37/3002; H01L 21/67184; H01L 21/6719; H01L 21/67196; H01L 21/67201; H01L 21/67248; H01L 21/26593
USPC ........... 250/443.1, 307, 310, 492.2, 306, 311, 250/440.11, 441.11, 453.11; 355/30, 53; 396/611, 604; 257/E21.26, E21.334, 257/E21.335, E21.336, E21.337, E21.66; 438/530
See application file for complete search history.

(56) References Cited

U.S. PATENT DOCUMENTS

| 5,244,820 A * | 9/1993 | Kamata et al. ............. 438/514 |
| 5,914,493 A * | 6/1999 | Morita et al. ............ 250/492.2 |
| 6,402,401 B1 * | 6/2002 | Ueda et al. .................. 396/611 |

(Continued)

FOREIGN PATENT DOCUMENTS

| JP | 4005938 | 11/2007 |
| JP | 4065528 | 3/2008 |

*Primary Examiner* — David A Vanore
(74) *Attorney, Agent, or Firm* — Oblon, McClelland, Maier & Neustadt, L.L.P.

(57) ABSTRACT

A charged particle beam drawing apparatus according to one embodiment of the present invention comprises a load lock chamber provided for introducing a target object from the outside and capable of switching an atmosphere state and a vacuum state, a transfer chamber arranged so as to be able to communicate with the load lock chamber and transferring the target object, a soaking chamber arranged so as to be able to communicate with the transfer chamber and having a temperature adjustment container for housing the target object therein and controlling a temperature of the target object with radiation and a temperature adjustment part for controlling a temperature of the temperature adjustment container, and a drawing chamber arranged so as to be able to communicate with the transfer chamber and drawing on the target object at a constant temperature.

20 Claims, 2 Drawing Sheets

(51) Int. Cl.
*H01J 37/30* (2006.01)
*H01J 37/18* (2006.01)

(56) References Cited

U.S. PATENT DOCUMENTS

| | | | |
|---|---|---|---|
| 6,471,422 B1 * | 10/2002 | Ueda et al. | 396/611 |
| 6,672,779 B2 * | 1/2004 | Ueda et al. | 396/604 |
| 6,982,782 B2 * | 1/2006 | Emoto | 355/53 |
| 7,304,302 B1 * | 12/2007 | Nunan et al. | 250/311 |
| 7,662,728 B2 * | 2/2010 | Kashiwagi et al. | 438/779 |
| 7,978,304 B2 * | 7/2011 | Emoto | 355/53 |
| 8,007,588 B2 * | 8/2011 | Ito et al. | 117/89 |
| 8,071,961 B2 * | 12/2011 | Mito et al. | 250/443.1 |
| 8,558,193 B2 * | 10/2013 | Maeda et al. | 250/443.1 |
| 2005/0274321 A1 * | 12/2005 | Ukei et al. | 118/715 |
| 2005/0280790 A1 * | 12/2005 | Emoto | 355/53 |
| 2007/0107656 A1 * | 5/2007 | Shinozaki et al. | 118/50 |
| 2007/0128364 A1 * | 6/2007 | Shinozaki et al. | 427/294 |
| 2009/0011149 A1 * | 1/2009 | Kashiwagi et al. | 427/578 |
| 2014/0034846 A1 * | 2/2014 | Lee et al. | 250/453.11 |
| 2014/0319373 A1 * | 10/2014 | Kawaguchi et al. | 250/453.11 |

* cited by examiner

CHARGED PARTICLE BEAM DRAWING APPARATUS AND CHARGED PARTICLE BEAM DRAWING METHOD

CROSS REFERENCE TO RELATED APPLICATIONS

This application is based upon and claims the benefit of priority from the prior Japanese Patent Application No. 2013-093686 filed in Japan on Apr. 26, 2013; the entire contents of which are incorporated herein by reference.

FIELD

The present invention relates to a charged particle beam drawing apparatus and a charged particle beam drawing method.

BACKGROUND

A charged particle beam drawing apparatus such as electron beam drawing apparatus is configured of a plurality of chambers such as drawing chamber for drawing on a target object with an electron beam and an alignment chamber for aligning a target object transferred into the drawing chamber.

A drawing accuracy in such a drawing apparatus depends on a distribution of inplane temperature of a target object, and thus a difference in inplane temperature of the target object needs to be as little as possible. Thus, the target object is kept at a constant temperature inside the alignment chamber therefor, for example.

Along with miniaturization of devices, drawing with a higher accuracy is required. However, the alignment chamber is provided with heat sources such as motors for aligning a target object and sensors for detecting a position of the target object, and a difference in inplane temperature of the target object is difficult to further reduce.

DETAILED DESCRIPTION

A charged particle beam drawing apparatus according to one embodiment of the present invention comprises a load lock chamber provided for introducing a target object from the outside and capable of switching an atmosphere state and a vacuum state, a transfer chamber arranged so as to be able to communicate with the load lock chamber and transferring the target object, a soaking chamber arranged so as to be able to communicate with the transfer chamber and having a temperature adjustment container for housing the target object therein and controlling a temperature of the target object with radiation and a temperature adjustment part for controlling a temperature of the temperature adjustment container, and a drawing chamber arranged so as to be able to communicate with the transfer chamber and drawing on the target object at a constant temperature.

A charged particle beam drawing method according to the embodiment of the present invention comprises arranging a target object in a temperature adjustment container inside a soaking chamber, controlling a temperature of the temperature adjustment container by a temperature adjustment part provided outside the soaking chamber, controlling a temperature of the target object with radiation of the temperature adjustment container thereby to set the target object at a constant temperature, and drawing on the target object at a constant temperature.

The charged particle beam drawing apparatus and the charged particle beam drawing method according to the embodiment of the present invention will be described below.

Figure 1:
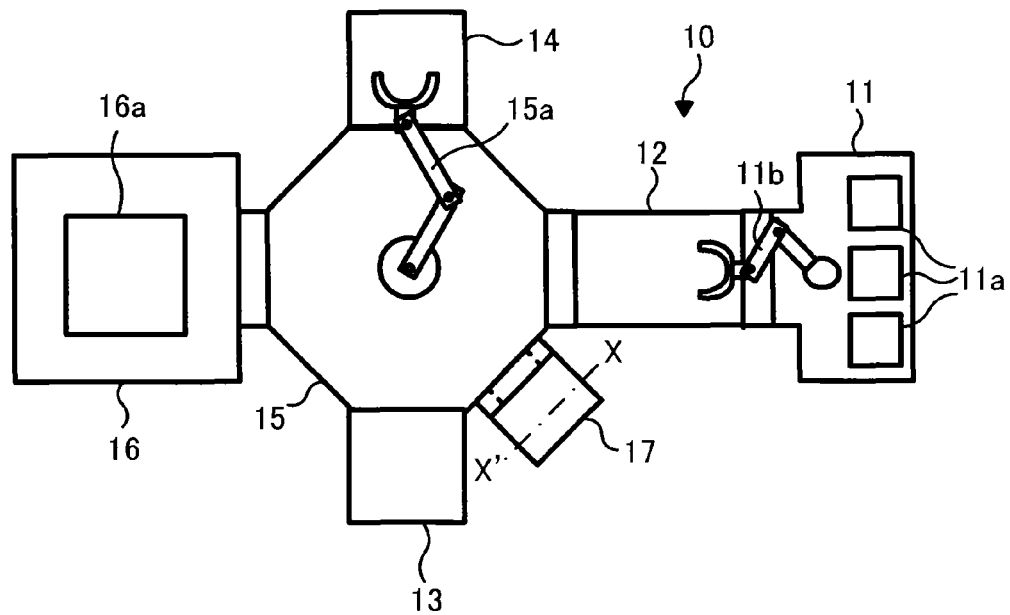
FIG. 1 is a diagram schematically illustrating a structure of an electron beam drawing apparatus according to one embodiment of the present invention.

FIG. 1 is a diagram schematically illustrating a structure of an electron beam drawing apparatus as one form of the charged particle beam drawing apparatus according to the present invention. The electron beam drawing apparatus 10 illustrated in FIG. 1 has a carry-in/out part 11 on which a target object such as mask substrate is placed, a load lock chamber 12 capable of switching an atmosphere state and a vacuum state, an alignment chamber 13 for aligning the target object, a mask cover housing chamber 14 capable of housing a mask cover attachable/detachable to/from the target object therein, a vacuum robot chamber 15 having a vacuum transferring robot 15a therein, and a drawing chamber 16 for drawing on the target object. The electron beam drawing apparatus 10 further has a soaking chamber 17 for setting the target object at a constant temperature.

The carry-in/out part 11 has a plurality of placement parts 11a capable of placing a target object thereon. The carry-in/out part 11 has an atmosphere transferring robot 11b for transferring a target object in atmosphere therein.

The carry-in/out part 11 is arranged so as to be able to communicate with the load lock chamber 12. The inside of the load lock chamber 12 is in atmosphere or vacuum with air supply or exhaust.

The vacuum robot chamber 15 which is a transfer chamber for transferring the target object is arranged so as to be able to communicate with the load lock chamber 12. A horizontal cross-section shape of the vacuum robot chamber 15 is substantially octagonal, for example. The vacuum robot chamber 15 has a vacuum transferring robot 15a for transferring the target object in vacuum therein.

The alignment chamber 13 is arranged so as to be able to communicate with the vacuum robot chamber 15 such that a phase connected to the vacuum robot chamber 15 is substantially perpendicular to the load lock chamber 12. The mask cover housing chamber 14 is arranged at another side so as to be able to communicate with the vacuum robot chamber 15.

The alignment chamber 13 performs a processing of detecting a position misalignment and a rotation misalignment of the transferred target object and correcting the position misalignment and the rotation misalignment of the target object, or an alignment processing.

The mask cover housing chamber 14 can house a mask cover for suppressing charging of the target object therein, and can attach or detach the mask cover to or from the target object.

The drawing chamber 16 is arranged so as to be able to communicate with the vacuum robot chamber 15 such that a phase connected to the vacuum robot chamber 15 is opposite to the load lock chamber 12. A stage 16a movable inside the drawing chamber 16 is arranged in the chamber 16. A target object is placed on the stage 16a in the drawing chamber 16, and drawing is performed.

Further, the soaking chamber 17 is arranged so as to be able to communicate with the vacuum robot chamber 15 such that a phase connected to the vacuum robot chamber 15 is a phase between the load lock chamber 12 and the alignment chamber 13, for example.

In the electron beam drawing apparatus 10, the vacuum robot chamber 15, the mask cover housing chamber 14, the alignment chamber 13, the drawing chamber 16 and the soaking chamber 17 configure a vacuum unit.

Figure 2:
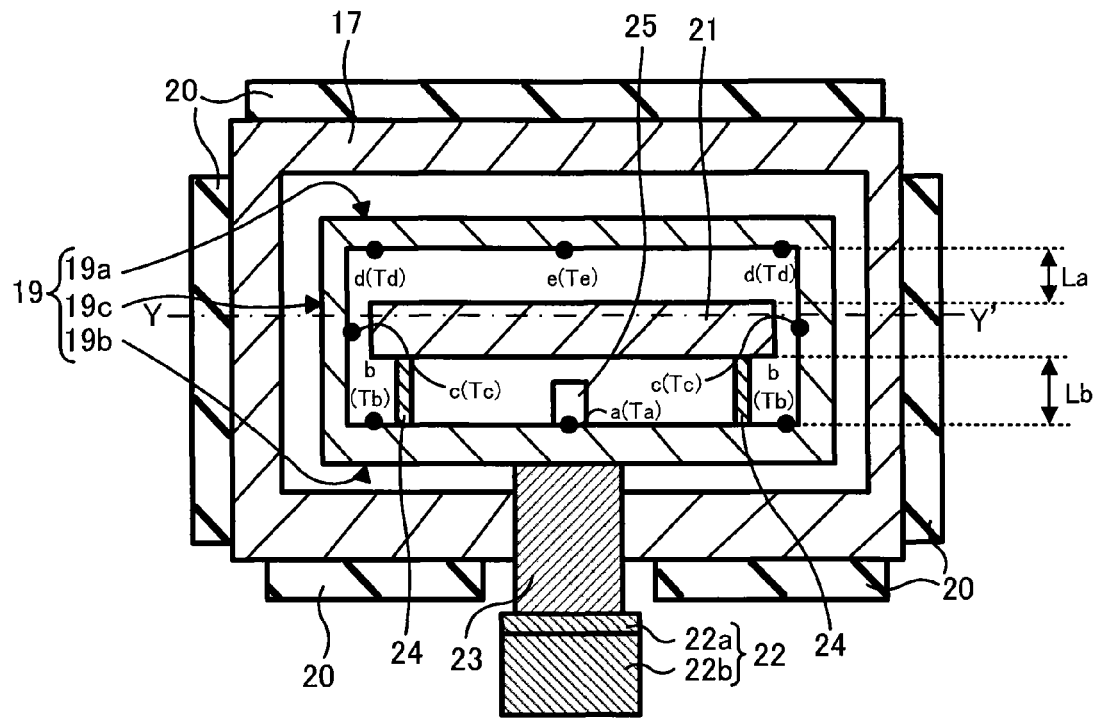
FIG. 2 is a cross-section view of a soaking chamber along the dotted line X-X' of FIG. 1.
Figure 3:
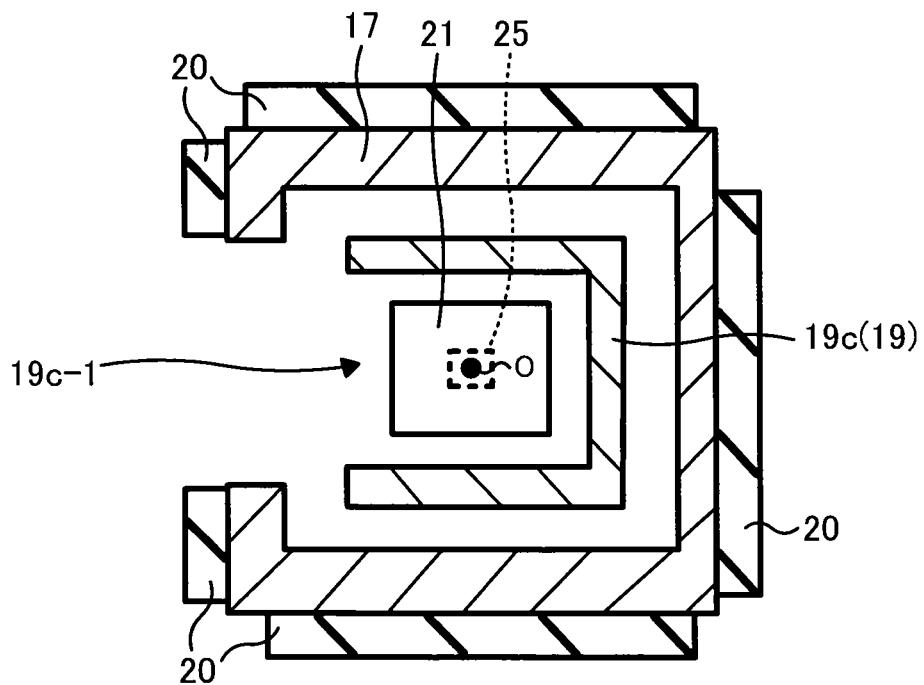
FIG. 3 is a horizontal cross-section view of the soaking chamber along the dotted line Y-Y' of FIG. 2.

FIG. 2 is a cross-section view of the soaking chamber 17 along the dotted line X-X' of FIG. 1. FIG. 3 is a horizontal cross-section view of the soaking chamber 17 along the dotted line Y-Y' of FIG. 2. The soaking chamber 17 is arranged so as to be able to communicate with the vacuum robot chamber 15. A heat insulating member 20 is provided on the outer periphery of the soaking chamber 17. The heat insulating member 20 is a water cooling system (water cooling jacket) through which constant temperature water at a predetermined temperature flows, for example. The heat insulating member 20 suppresses a temperature inside the soaking chamber 17 from changing due to an outside temperature.

The heat insulating member 20 can cause generation of particles, and is preferably arranged outside the soaking chamber 17 as illustrated.

A temperature adjustment container 19 made of a member having a radiation property is arranged inside the soaking chamber 17 in order to suppress a difference in inplane temperature of a target object 21 and to control the target object 21 at a predetermined temperature. A plurality of support bodies 24 for supporting the target object 21 and a temperature sensor 25 for detecting a temperature of the target object 21 are arranged inside the temperature adjustment container 19. Then, the temperature adjustment container 19 is connected to a temperature adjustment part 22 provided outside the soaking chamber 17 via a heat transfer member 23 made of Cu, for example.

The temperature adjustment container 19 is configure of an upper plate 19a and a lower plate 19b, which are parallel with each other, and side plates 19c connecting the upper plate 19a and the lower plate 19b. The upper plate 19a and the lower plate 19b are square, and an opening 19c-1 for transferring in and out the target object 21 is provided at part of the side plate 19c as illustrated in FIG. 3.

The materials of the temperature adjustment container 19 preferably have a relatively high heat conductivity of about 391 W/m·k and a high radiation rate in terms of improvement in radiation efficiency (time required to set a constant temperature) and enhancement in uniformity of inplane temperature. For example, formed films such as AlTiN-coated Cu (which will be denoted as Cu+AlTiN below), Al+black nickel plate and Al+AlTiN may be employed, and Cu+DLC may be also employed as the materials. Bulk materials such as SiC and Cu may be employed as the materials in order to suppress particles or contamination from occurring.

A radiation rate may be different between the inner wall and the outer wall of the temperature adjustment container 19. A radiation rate of the inner wall is set at 0.5 or more and a radiation rate of the outer wall is 0.2 or less with the surface processing, for example, thereby efficiently adjusting a temperature.

A plurality of support bodies 24 for supporting the target object 21 are provided inside the temperature adjustment container 19 as illustrated in FIG. 2. The support bodies 24 are preferably provided such that a distance La between the top face of the placed target object 21 and the inner wall of the upper plate 19a is substantially equal to a distance Lb between the bottom face of the target object 21 and the inner wall of the lower plate 19b. As illustrated in FIG. 3, the target object 21 is preferably provided such that a rotation center O of the upper plate 19a and the lower plate 19b substantially matches with a rotation center of target object 21. Each support body 24 preferably has conductivity in order to suppress the target object 21 from being charged, and each support body 24 is preferably made of resin in order to suppress the generation of particles from the back face of the placed target object 21.

The temperature adjustment part 22 controls a temperature of the temperature adjustment container 19, and is configured of a Peltier device 22a and a cooling part 22b for cooling the peltier device 22a, for example. The temperature adjustment container 19 is controlled at a predetermined temperature via the heat transfer member 23 by the Peltier device 22a. The temperature adjustment part 22 may be configured of a water cooling system.

The temperature sensor 25 is provided among a plurality of support bodies 24 on the lower plate 19b of the temperature adjustment container 19. The temperature sensor 25 preferably has a high resolution of 0.002° C. or more, for example.

Figure 4:
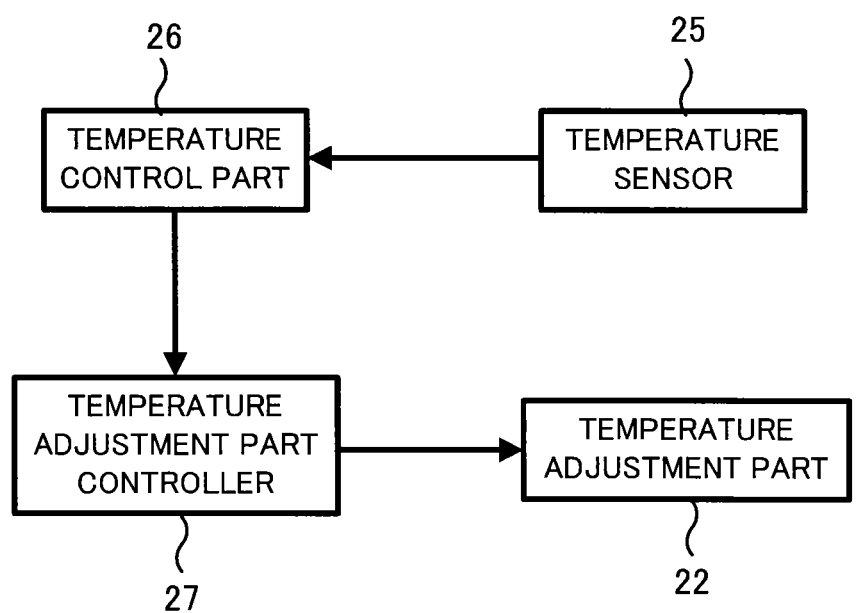
FIG. 4 is a block diagram of a control system for explaining a target object temperature control method by the soaking chamber.

FIG. 4 is a block diagram of a control system for explaining a target object temperature control method by the soaking chamber 17 described above. As illustrated in FIG. 4, the temperature sensor 25 is connected with a temperature adjuster as a temperature control part 26, for example. The temperature control part 26 is connected with a Peltier driver for driving the Peltier device as a temperature adjustment part driver 27 for driving the temperature adjustment part 22. Then, the Peltier device 22a as the temperature adjustment part 22 is connected to the temperature adjustment part driver 27, for example.

When a temperature of the target object 21 is detected by the temperature sensor 25, the detected temperature data is sent to the temperature control part 26. The temperature control part 26 compares the resultant temperature data with a desired target object temperature. Further, the temperature control part 26 controls the temperature adjustment part driver 27 such that the target object 21 substantially matches with the desired target object temperature. The temperature adjustment part driver 27 drives the temperature adjustment part 22 such that the target object 21 is substantially at a predetermined target object temperature. Consequently, the target object 21 inside the temperature adjustment container 19 reaches the predetermined temperature.

As described above, the temperature adjustment container 19 is temperature-controlled by the temperature adjustment part 22 but the temperature adjustment part 22 is connected to the bottom face of the temperature adjustment container 19 via the heat transfer member 23, and thus a temperature is the highest at the position connected to the heat transfer member 23 and a temperature gradually lowers away from the position. As illustrated in FIG. 2, the position connected to the heat transfer member 23 (the position as the rotation center of the lower plate 19b) is assumed as position a, the surrounding part of the lower plate 19b of the temperature adjustment container 19 is assumed as position b, the center part of the side plate 19c is assumed as position c, the surrounding part of the upper plate 19a is assumed as position d, and the position as the rotation center of the upper plate 19a is assumed as position e. Then, a temperature at the position a is assumed as Ta, a temperature at the position b is assumed as Tb, a temperature at the position c is assumed as Tc, a temperature at the position d is assumed as Td, and a temperature at the position e is assumed as Te. At this time, the temperatures at the respective positions are in Ta>Tb>Tc>Td>Te (where Ta+Te=Tz and Tb+Td=Tz). In this way, a temperature variation occurs also in the temperature adjustment container 19.

Herein, the target object 21 is controlled at a predetermined temperature with radiation from the upper plate 19a and radiation from the lower plate 19b in the temperature adjustment container 19. Thus, the target object 21 is arranged at the center of the temperature adjustment container 19 so that a temperature near the rotation center of the target object 21 is defined by the temperature Ta at the position a and the temperature Te at the position e (Tz/2−α) and a temperature near the surrounding part of the target object 21 is defined by the temperature Tb at the position b and the temperature Td at the position d (Tz/2−α). That is, the target object 21 can be controlled at a predetermined temperature and a difference in inplane temperature of the target object 21 can be made at 0.026° C. or less required for realizing a predetermined drawing accuracy, for example.

An electron beam drawing method using the electron beam drawing apparatus 10 described above will be described below. When the target object 21 is placed on the placement part 11a of the carry-in/out part 11, the atmosphere transferring robot 11b transfers the target object 21 into the load lock chamber 12.

When the target object 21 is transferred into the load lock chamber 12, the inside of the load lock chamber 12 is subjected to vacuuming to be vacuumed.

After the inside of the load lock chamber 12 is vacuumed, the target object 21 inside the load lock chamber 12 is transferred to the soaking chamber 17 by the vacuum transferring robot 15a.

When the target object 21 is transferred to the center of the temperature adjustment container 19 inside the soaking chamber 17, the temperature adjustment part 22 is driven for a predetermined temperature so that the target object 21 is set at a constant temperature.

When the target object 21 is completely set at a constant temperature, the target object 21 is transferred to the alignment chamber 13, the mask cover housing chamber 14, and the drawing chamber 16 in this order.

After the inside of the load lock chamber 12 is vacuumed, the target object 21 inside the chamber 12 may be transferred to the alignment chamber 13 and the mask cover housing chamber 14 in this order, and then transferred into the soaking chamber 17, and then transferred to the drawing chamber 16.

The target object 21 is transferred onto the stage 16a in the drawing chamber 16 and a temperature of the target object 21 and a temperature inside the drawing chamber 16 are equilibrated so that drawing is performed on the target object 21. The drawn target object 21 is transferred to the mask cover housing chamber 14 and the load lock chamber 12 in this order by the vacuum transferring robot 15a.

When the target object 21 is transferred into the load lock chamber 12, the inside of the load lock chamber 12 enters atmospheric.

After the inside of the load lock chamber 12 is made atmospheric, the target object 21 inside the chamber 12 is transferred onto the placement part 11a in the carry-in/out part 11 by the atmosphere transferring robot 11b. The target object 21 placed on the placement part 11a is returned to a mask storage (not illustrated), for example.

With the charged particle beam drawing apparatus and the charged particle beam drawing method described above, the target object 21 is set at a constant temperature by the soaking chamber 17, thereby obtaining an excellent drawing accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the present invention can be applied to all the charged particle beam drawing apparatuses including an ion beam irradiation apparatus, not limited to an electron beam drawing apparatus.

What is claimed is:

1. A charged particle beam drawing apparatus comprising:
   a load lock chamber provided for introducing a target object from the outside and capable of switching an atmosphere state and a vacuum state;
   a transfer chamber arranged so as to be able to communicate with the load lock chamber and transferring the target object;
   a soaking chamber arranged so as to be able to communicate with the transfer chamber and having a temperature adjustment container for housing the target object therein and controlling a temperature of the target object with radiation, and a temperature adjustment part for controlling a temperature of the temperature adjustment container; and
   a drawing chamber arranged so as to be able to communicate with the transfer chamber and drawing on the target object at a constant temperature.

2. The charged particle beam drawing apparatus according to claim 1,
   wherein the soaking chamber has a heat insulating member on an outer periphery.

3. The charged particle beam drawing apparatus according to claim 1,
   wherein the temperature adjustment container has support bodies for arranging the target object thereon such that a distance between a top face of the target object and an upper inner wall of the temperature adjustment container is substantially equal to a distance between a bottom face of the target object and a lower inner wall of the temperature adjustment container.

4. The charged particle beam drawing apparatus according to claim 3,
   wherein the support bodies are provided such that the target object can be arranged to substantially match a rotation center of the target object with a rotation center of a top and a bottom of the temperature adjustment container.

5. The charged particle beam drawing apparatus according to claim 3,
   wherein the support bodies have conductivity.

6. The charged particle beam drawing apparatus according to claim 3,
   wherein the support bodies are made of resin.

7. The charged particle beam drawing apparatus according to claim 1,
   wherein a radiation rate of an inner wall of the temperature adjustment container is different from a radiation rate of an outer wall of the temperature adjustment container.

8. The charged particle beam drawing apparatus according to claim 7,
wherein the radiation rate of the inner wall of the temperature adjustment container is 0.5 or more and the radiation rate of the outer wall of the temperature adjustment container is 0.2 or less.

9. The charged particle beam drawing apparatus according to claim 3,
wherein the temperature adjustment container further has a temperature sensor for detecting a temperature of the target object placed on the support bodies, and
the temperature adjustment part controls a temperature of the temperature adjustment container based on a temperature of the target object detected by the temperature sensor.

10. The charged particle beam drawing apparatus according to claim 1,
wherein the temperature adjustment part is arranged outside the temperature adjustment container.

11. The charged particle beam drawing apparatus according to claim 10,
wherein the temperature adjustment container is connected to the temperature adjustment part via a heat transfer member.

12. The charged particle beam drawing apparatus according to claim 10,
wherein the heat transfer member is connected to a bottom of the temperature adjustment container at a rotation center of the bottom of the temperature adjustment container.

13. The charged particle beam drawing apparatus according to claim 1, further comprising:
an alignment chamber arranged so as to be able to communicate with the transfer chamber between the load lock chamber and the drawing chamber and performing an alignment processing on the target object,
wherein the soaking chamber is arranged so as to be able to communicate with the transfer chamber between the alignment chamber and the load lock chamber.

14. The charged particle beam drawing apparatus according to claim 13,
wherein the transfer chamber, the soaking chamber, the drawing chamber and the alignment chamber configure a vacuum unit.

15. A charged particle beam drawing method comprising:
arranging a target object in a temperature adjustment container inside a soaking chamber, controlling a temperature of the temperature adjustment container by a temperature adjustment part provided outside the soaking chamber, and controlling a temperature of the target object with radiation of the temperature adjustment container to set the target object at a constant temperature; and
drawing on the target object at a constant temperature.

16. The charged particle beam drawing method according to claim 15,
wherein the target object is arranged in the temperature adjustment container such that a distance between a top face of the target object and an upper inner wall of the temperature adjustment container is substantially equal to a distance between a bottom face of the target object and a lower inner wall of the temperature adjustment container.

17. The charged particle beam drawing method according to claim 16,
wherein the target object is arranged in the temperature adjustment container such that a rotation center of the target object substantially matches with a rotation center of a top and a bottom of the temperature adjustment container.

18. The charged particle beam drawing method according to claim 15,
wherein the temperature adjustment part controls a temperature of the temperature adjustment container based on a temperature of the target object detected by a temperature sensor for detecting a temperature of the target object arranged in the temperature adjustment container.

19. The charged particle beam drawing method according to claim 18,
wherein the temperature adjustment part controls a temperature of the temperature adjustment container via a heat transfer member connecting the temperature adjustment part and the temperature adjustment container.

20. The charged particle beam drawing method according to claim 19,
wherein the temperature adjustment part controls a temperature of the temperature adjustment container via the heat transfer member connecting the temperature adjustment part and a rotation center of a bottom face of the temperature adjustment container.

\* \* \* \* \*